(12) United States Patent
Takasu

(10) Patent No.: US 8,558,302 B2
(45) Date of Patent: Oct. 15, 2013

(54) NONVOLATILE SEMICONDUCTOR MEMORY DEVICE

(75) Inventor: Hiroaki Takasu, Chiba (JP)

(73) Assignee: Seiko Instruments Inc. (JP)

( * ) Notice: Subject to any disclaimer, the term of this patent is extended or adjusted under 35 U.S.C. 154(b) by 87 days.

(21) Appl. No.: 13/374,282

(22) Filed: Dec. 20, 2011

(65) Prior Publication Data
US 2012/0168845 A1    Jul. 5, 2012

(30) Foreign Application Priority Data

Dec. 29, 2010 (JP) ................................. 2010-294481
Dec. 29, 2010 (JP) ................................. 2010-294482
Nov. 21, 2011 (JP) ................................. 2011-254289

(51) Int. Cl.
*H01L 29/788* (2006.01)

(52) U.S. Cl.
USPC ........... 257/316; 257/314; 257/315; 257/317; 257/E29.03; 438/201; 438/211; 438/257; 365/185.18; 365/185.26

(58) Field of Classification Search
USPC ............ 257/316, 314, 315, 317–326, E29.03; 438/201, 211, 257; 365/185.18, 365/185.26, 185.01
See application file for complete search history.

(56) References Cited

U.S. PATENT DOCUMENTS 6,097,056 A * 8/2000 Hsu et al. ...................... 257/315

FOREIGN PATENT DOCUMENTS

JP          01160058          6/1989

\* cited by examiner

*Primary Examiner* — Thinh T Nguyen
(74) *Attorney, Agent, or Firm* — Adam & Wilks

(57) ABSTRACT

Provided is an electrically erasable and programmable nonvolatile semiconductor memory device having a small hole in a second conductivity-type drain region, a tunnel insulating film formed on the surface of the hole, and a protrusion extended from the floating gate electrode and arranged to fill the hole. Further a tunneling restriction region which is an electrically floating first conductivity type region arranged in a vicinity of the surface of the drain region around the hole to define the size of the tunnel region through which the tunnel current flows.

9 Claims, 3 Drawing Sheets

NONVOLATILE SEMICONDUCTOR MEMORY DEVICE

BACKGROUND OF THE INVENTION

1. Field of the Invention

The present invention relates to an electrically erasable and programmable nonvolatile semiconductor memory device.

2. Description of the Related Art

A basic unit of an electrically erasable and programmable nonvolatile semiconductor memory is a memory cell whose structure is as follows: an N-type source region and a N-type drain region disposed on both side of a channel region and both disposed on a P-type silicon substrate; a tunnel region disposed on a part of the drain region; a floating gate electrode formed on a tunnel insulating film formed of a thin silicon oxide film or a composite film of a silicon oxide film and a silicon nitride film having a thickness equal to or less than a hundred angstrom; and a control gate electrode formed on a control insulating film formed of a thin insulating film and having a strong capacitive coupling with the floating gate electrode. The floating gate electrode is isolated electrically from the circumference and is capable of storing electric charges inside of it.

The floating gate electrode and the control gate electrode are both extended upon the channel region, and the conductance of the channel region varies according to the potential of the floating gate electrode. Accordingly change of the electric charges in the floating gate electrode can prompt a nonvolatile memory of information. Application of a voltage of about 15 volts or more to the drain region and also to the tunnel region against the control gate electrode generates a tunnel current which ejects electrons stored in the floating gate electrode to the drain region through the tunnel insulating film formed in the tunnel region, and it is also possible to inject electrons into the floating gate electrode vice versa.

As described above change of the electric charge in the floating gate causes the functions as a nonvolatile memory. A lot of memory cells having such functions can be configured in columns and rows to form a memory array to have a large volume nonvolatile semiconductor memory device.

At this point the tunnel region having the tunnel insulating film through which electrons transport is especially important. On one hand the tunnel insulating film enables a quite lot of rewriting of memory information up to some hundred thousands times, and on the other hand it plays a dominant role against the demand for long term storage of memory information (retention of the electric charges) for a few decades.

As an improvement in reliability of the tunnel region and the tunnel insulating film, a device in which a tunnel region having a different impurity concentration is formed next to the drain region to improve the program/erase characteristic (endurance characteristic) or the retention characteristic is proposed as in, for example, Japanese Patent Publication H01-160058A.

SUMMARY OF THE INVENTION

The above-mentioned improvement of the semiconductor device in which a special tunnel region is formed independently from the drain region has problems such as an increase in the occupation area which leads to an increase in cost.

It is an object of the present invention to provide an electrically erasable and programmable nonvolatile semiconductor memory device having a high reliability caused by suppression of degradation of the tunnel insulating film without increasing the occupation area.

In order to solve the above-mentioned problems an electrically erasable and programmable nonvolatile semiconductor memory device according to the present invention includes:

a first conductivity-type semiconductor substrate;

a second conductivity-type source region and a drain region disposed apart to face each other on a surface of the semiconductor substrate;

a channel formation region sandwiched by the source region and the drain region, formed on the surface of the semiconductor substrate;

a floating gate electrode disposed on a gate insulating film over the source region, the drain region and the channel region;

a control gate electrode disposed on a control insulating film over the floating gate electrode and capacitively coupled to the floating gate electrode;

a hole formed in a part of the drain region, dug down from a surface of the drain region;

a protrusion extended from the floating gate electrode, disposed to fill the hole;

a tunneling restriction region disposed around the protrusion for defining a tunnel region; and a tunnel insulating film formed between a surface of the hole and the protrusion in the tunnel region.

In one aspect the tunneling restriction region of the electrically erasable and programmable nonvolatile semiconductor memory device is an electrically floating first conductivity-type region disposed in a vicinity of the surface of the drain region around the hole.

In another aspect the tunneling restriction region of the electrically erasable and programmable nonvolatile semiconductor memory device is a second tunnel insulating film whose film thickness is thicker than the tunnel insulating film formed in the tunnel region, disposed between the protrusion and a second conductivity-type region disposed in a vicinity of the surface of the drain region around the hole.

By the improvements described above, an electrically erasable and programmable nonvolatile semiconductor memory device having a small occupation area, an efficient rewrite operation at a lower voltage during a data program/erase cycle and a high reliability realized by suppression of degradation in the tunnel insulating film can be obtained.

DETAILED DESCRIPTION OF THE PREFERRED EMBODIMENT

Hereinafter, an electrically erasable and programmable nonvolatile semiconductor memory device according to the present invention is described with reference to the drawings for different embodiments.

1. First Embodiment

Figure 1:
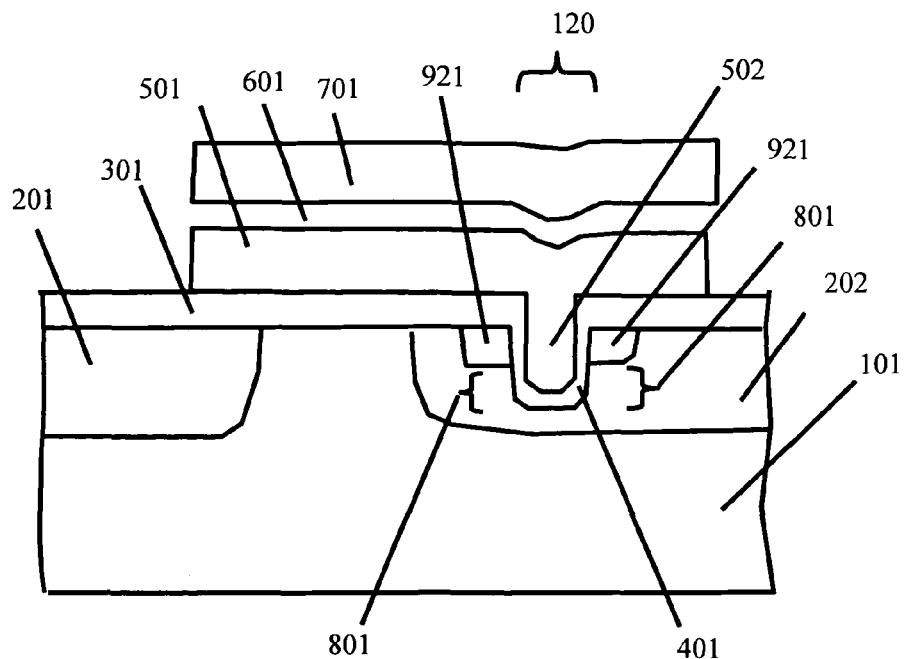
FIG. 1 shows a cross-sectional view illustrating the first embodiment of an electrically erasable and programmable nonvolatile semiconductor memory device according to the present invention.

FIG. 1 shows a cross-sectional view illustrating the first embodiment of an electrically erasable and programmable nonvolatile semiconductor memory device according to the present invention; a source region 201 and a drain region 202 of the second conductivity-type, which is N-type in this case, are formed apart to face each other on a surface of the semiconductor substrate of the first conductivity-type, which is P-type in this case, to define a channel region on the surface of the semiconductor substrate between the source region and the drain region; a floating gate electrode 501, which is formed from polycrystalline silicon or the like, is disposed on a gate insulating film 301, which is formed, for example, from silicon oxide film and having a thickness of 400 angstrom, over the source region, the drain region and the channel region; a control gate electrode 701, which is formed from polycrystalline silicon or the like, is disposed on a control insulating film, which is formed from a silicon oxide film, a silicon nitride film or a composite film of these films, over the floating gate electrode 501 to have a capacitive coupling with it.

A hole 120 of a tiny size of 4000 angstroms in diameter and 3000 angstroms in depth is formed in a part of the drain region 202, dug down from the surface of the drain region 202. The floating gate electrode 501 has a protrusion 502 which is disposed to fill the hole. In a tunnel region 801 in the drain region 202 a tunnel insulating film 401, which is formed from a silicon oxide film, a silicon nitride film or a composite film of these films and has a thickness of 80 angstroms, is formed between the surface of the hole and the protrusion extended from the floating gate electrode 501 disposed to fill the hole.

Further a tunneling restriction region 921, which is an electrically floating P-type conductivity region having an impurity concentration of $10^{19}$ atoms/cm$^3$, is arranged in a vicinity of the surface of the drain region 202 around the hole 120 from the surface to a depth of 800 angstroms to define the size of the tunnel region through which the tunnel current flows.

Since the tunnel region 801 formed on the side wall of the hole 120 is defined to be a part from the bottom of the hole 120 to the bottom surface of the tunneling restriction region 921 to have an actual depth of only 2200 angstroms and the diameter of the hole is 4000 angstroms, the tunnel region 801 and the tunnel insulating film 401 can be made to have a tiny area even the bottom part of the hole is taken into account.

Conventionally the tunnel insulating film 401 was formed only on the surface of the tunnel region 801 provided on the surface of the drain region 202. In the embodiment according to the present invention the tunnel insulating film 401 is formed along the side wall and the bottom of the hole. Accordingly the tunnel region 801 and the tunnel insulating film 401 can be made to have a tiny area, which the conventional processing accuracy was unable to achieve in a planar alignment. The formation of the tunnel region having a tiny area permits increase of a relative index, which is known as a coupling ratio, of the capacitors: one formed between the control gate electrode 701 and the floating gate electrode 501 with the control insulating film therebetween, and the other formed between the floating gate electrode 501 and the drain region 202 with the tunnel insulating film 401 therebetween.

The depth of the hole is chosen to be 3000 angstroms in the first embodiment shown by FIG. 1. The depth is, however, preferred to be shallower to form a tunnel region with a tiny area, more preferably less than 3000 angstroms since the tunnel region 801 formed on the side wall of the hole 120 is defined to be the part from the bottom of the hole 120 to the bottom surface of the tunneling restriction region 921. Enough benefit can be obtained even when the depth is 5000 angstroms limited by the ability of the processing machines.

The diameter of the hole 120 is also preferable to be smaller since the bottom surface of the hole 120 also forms a part of the tunnel region 801. Accordingly the diameter of the hole 120 is best preferred to be formed smaller than 5000 angstrom, and preferred to be formed smaller than 10000 angstroms if there is a limitation on the ability of the processing machines for digging small holes, giving benefit for making the tunnel region 801 with a tiny area.

A large coupling ratio enables effective transfer of the voltage applied to the control gate electrode 701 to the floating gate electrode 501, producing an enough voltage difference easily between the floating gate electrode 501 and the drain region 202 through the tunnel insulating film 401, which enables reduction of the applied voltage to the control gate electrode 701 needed in data rewrite operation as compared to the conventional memory device. The floating gate electrode 501 and the control gate electrode 701 are not needed to be made large to obtain a large coupling ratio as in the conventional memory device, permitting reduction of the whole memory cell.

The tunneling restriction region 921, which is an electrically floating P-type conductivity region, is arranged in a vicinity of the surface of the drain region 202 around the hole 120 from the surface to a depth of 800 angstroms. Its impurity concentration of $10^{19}$ atoms/cm$^3$ avoids easy formation of an inversion layer or a depletion layer. Accordingly a region where defects easily generate in a vicinity of the drain region 202 is not used as a tunnel region 801. Transfer (tunneling) of electrons can be carried out between the drain region 202 and the floating gate electrode through the tunnel insulating film 401 formed on the inner region having an excellent crystallization with fewer defects.

At least one of the tunnel insulating film 401 and the control insulating film 601 is a composite film of a silicon oxide film and a silicon nitride film to further improve reliability.

2. Second Embodiment

Figure 2:
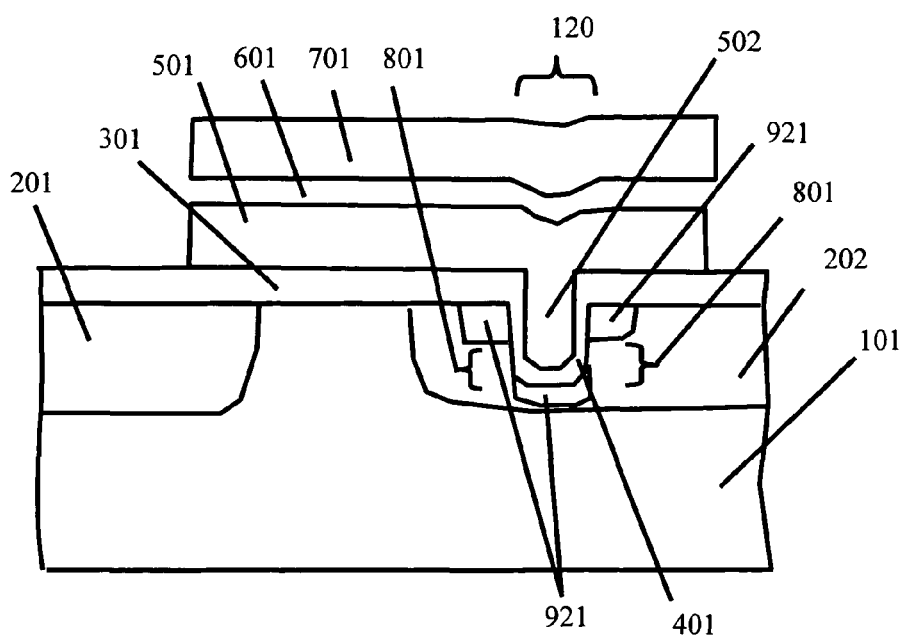
FIG. 2 shows a cross-sectional view illustrating the second embodiment of an electrically erasable and programmable nonvolatile semiconductor memory device according to the present invention.

FIG. 2 shows a cross-sectional view illustrating the second embodiment of an electrically erasable and programmable nonvolatile semiconductor memory device according to the present invention.

Difference to the first embodiment shown by FIG. 1 is that a second tunneling restriction region 921, which is an electrically floating P-type conductivity region, is additionally formed along the bottom of the hole formed in the drain region 202, preventing the formation of the tunnel region 801 at the bottom of the hole 120.

Further reduction of the area of the tunneling region 801 and further increase of the coupling ratio can be achieved compared to the first embodiment shown by FIG. Explanation for other part of the structure having the same numeral as in FIG. 1 is omitted.

3. Third Embodiment

Figure 3:
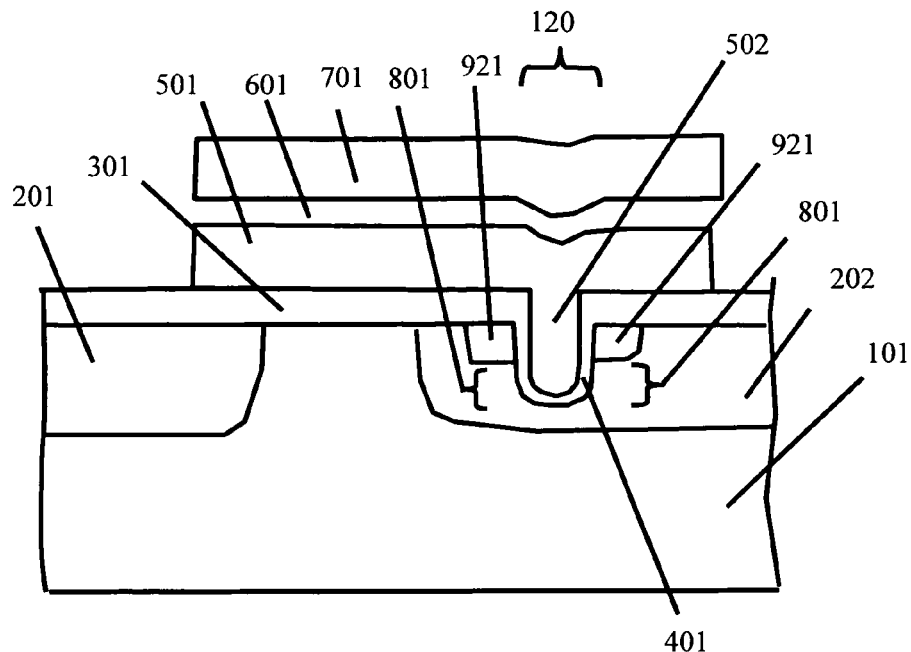
FIG. 3 shows a cross-sectional view illustrating the third embodiment of an electrically erasable and programmable nonvolatile semiconductor memory device according to the present invention.

FIG. 3 shows a cross-sectional view illustrating the third embodiment of an electrically erasable and programmable nonvolatile semiconductor memory device according to the present invention.

Difference to the first embodiment shown by FIG. 1 is that the edge of the bottom region of the hole formed in the drain region is rounded to give a round shape to the bottom region. The round shape of the bottom region of the hole 202 which the floating gate electrode 501 fills enables prevention of the local concentration of the high electric field at the time of the electron injection into the floating gate electrode 501 and the electron ejection to the drain region 801 during a data program/erase cycle, increasing the number of the program/erase cycle to obtain an electrically erasable and programmable nonvolatile semiconductor memory device with high reliability. Explanation for other part of the structure having the same numeral as in FIG. 1 is omitted.

By the improvements described above an electrically erasable and programmable nonvolatile semiconductor memory device having a small occupation area, an efficient rewrite operation at a lower voltage in a program/erase cycle and a high reliability realized by suppression of degradation in the tunnel insulating film can be obtained can be obtained

4. Fourth Embodiment

Figure 4:
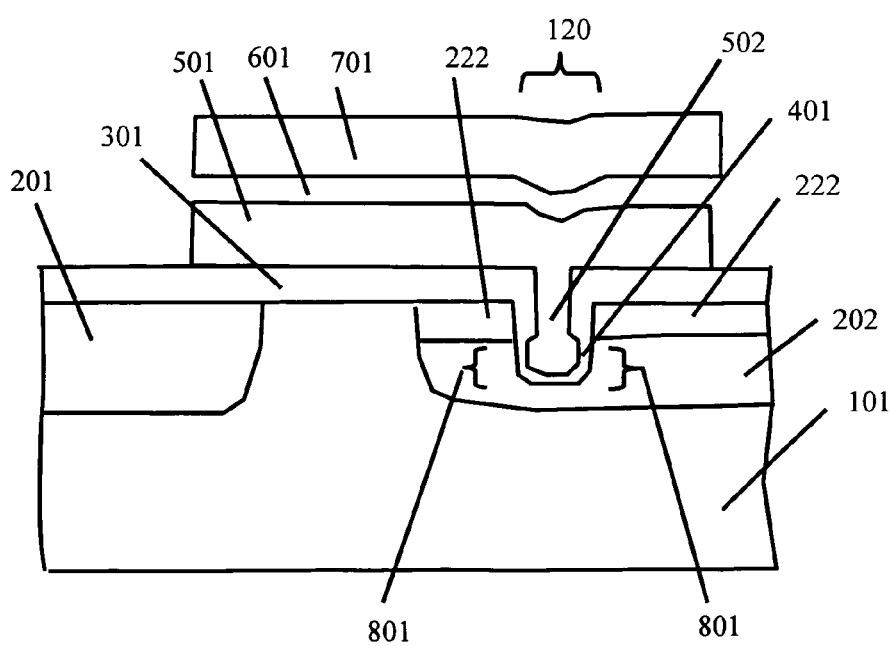
FIG. 4 shows a cross-sectional view illustrating the fourth embodiment of an electrically erasable and programmable nonvolatile semiconductor memory device according to the present invention.

FIG. 4 shows a cross-sectional view illustrating the fourth embodiment of an electrically erasable and programmable nonvolatile semiconductor memory device according to the present invention; a source region 201 and a drain region 202 of the second conductivity-type, which is N-type in this case, are formed apart to face each other on a surface of the semiconductor substrate of the first conductivity-type, which is P-type in this case, to define a channel region on the surface of the semiconductor substrate between the source region and the drain region; a floating gate electrode 501, which is formed from polycrystalline silicon or the like, is disposed on a gate insulating film 301, which is formed, for example, from silicon oxide film and having a thickness of 400 angstroms; over the source region, the drain region and the channel region;

a control gate electrode 701, which is formed from polycrystalline silicon or the like, is disposed on a control insulating film, which is formed from a silicon oxide film, a silicon nitride film or a composite film of these films, over the floating gate electrode 501 to have a capacitive coupling with it.

A hole 120 of a tiny size of 4000 angstroms in diameter and 3000 angstroms in depth is formed in a part of the drain region 202, dug down from the surface of the drain region 202. The floating gate electrode 501 has a protrusion 502 which is disposed to fill the hole. In a tunnel region 801 in the drain region 202 a tunnel insulating film 401, which is formed from a silicon oxide film, a silicon nitride film or a composite film of these films and has a thickness of 80 angstroms, is formed between the surface of the hole and the protrusion extended from the floating gate electrode 501 disposed to fill the hole.

Further an N-type conductivity high impurity concentration region 222 having an impurity concentration of $10^{19}$ atoms/cm$^3$, is arranged in a vicinity of the surface of the drain region 202 around the hole 120 from the surface to a depth of 2000 angstroms to define the size of the tunnel region through which the tunnel current flows. The second tunnel insulating film having a thickness thick enough to inhibit the generation of tunneling phenomenon even at the maximum electric field applied between the drain region 202 and the floating gate electrode 501 is formed on the side surface of the N-type conductivity high impurity concentration region 222 having an impurity concentration of $10^{19}$ atoms/cm$^3$ arranged around the hole to form a tunneling restriction region. The impurity concentration of the N-type conductivity high impurity concentration region 222 is $10^{19}$ atoms/cm$^3$, which is high enough to form a silicon oxide film thicker than that formed on the side surface of the drain region 202 by thermal oxidation. Any special process is not needed for this step, which is an advantage in manufacturing.

Since the tunnel region 801 formed on the side wall of the hole 120 is defined to be a part from the bottom of the hole 120 to the bottom surface of the N-type conductivity high impurity concentration region 222 to have an actual depth of only 1000 angstroms and the diameter of the hole is 4000 angstroms, the tunnel region 801 and the tunnel insulating film 401 can be made to have a tiny area even the bottom part of the hole is taken into account.

Conventionally the tunnel insulating film 401 was formed only on the surface of the tunnel region 801 provided on the surface of the drain region 202. In the embodiment according to the present invention the tunnel insulating film 401 is formed along the side wall and the bottom of the hole. Accordingly the tunnel region 801 and the tunnel insulating film 401 can be made to have a tiny area, which the conventional processing accuracy was unable to achieve in a planar alignment. The formation of the tunnel region having a tiny area permits increase of a relative index, which is known as a coupling ratio, of the capacitors: one formed between the control gate electrode 701 and the floating gate electrode 501 with the control insulating film therebetween, and the other formed between the floating gate electrode 501 and the drain region 202 with the tunnel insulating film 401 therebetween.

The depth of the hole is chosen to be 3000 angstroms in the fourth embodiment shown by FIG. 4. The depth is, however, preferred to be shallower to form a tunnel region with a tiny area, more preferably less than 3000 angstroms since the tunnel region 801 formed on the side wall of the hole 120 is defined to be the part from the bottom of the hole 120 to the bottom surface of the N-type conductivity high impurity concentration region 222. Enough benefit can be obtained even when the depth is 5000 angstroms limited by the ability of the processing machines.

The diameter of the hole 120 is also preferable to be smaller since the bottom surface of the hole 120 also forms a part of the tunnel region 801. Accordingly the diameter of the hole 120 is best preferred to be formed smaller than 5000 angstrom, and preferred to be formed smaller than 10000 angstroms if there is a limitation on the ability of the processing machines for digging small holes, giving benefit for making the tunnel region 801 with a tiny area.

A large coupling ratio enables effective transfer of the voltage applied to the control gate electrode 701 to the floating gate electrode 501, producing an enough voltage difference easily between the floating gate electrode 501 and the drain region 202 through the tunnel insulating film 401, which enables reduction of the applied voltage to the control gate electrode 701 needed in data rewrite operation as compared to the conventional memory device. The floating gate electrode 501 and the control gate electrode 701 are not needed to be made large to obtain a large coupling ratio as in the conventional memory device, permitting reduction of the whole memory cell.

The N-type conductivity high impurity concentration region 222 having an impurity concentration of $10^{19}$ atoms/cm$^3$ is arranged in a vicinity of the surface of the drain region 202 around the hole 120 from the surface to a depth of 1000 angstroms. The second tunnel insulating film having a thickness thicker than that formed on the side surface of the drain region 202 and thick enough to inhibit the generation of tunneling phenomenon in the operating voltage range is formed on the side surface of the N-type conductivity high impurity concentration region 222. Accordingly a region where defects easily generate in a vicinity of the drain region 202 is not used as a tunnel region 801. Transfer (tunneling) of electrons can be carried out between the drain region 202 and the floating gate electrode through the tunnel insulating film 401 formed on the inner region having an excellent crystallization with fewer defects.

At least one of the tunnel insulating film 401 and the control insulating film 601 is a composite film of a silicon oxide film and a silicon nitride film to further improve reliability.

5. Fifth Embodiment

Figure 5:
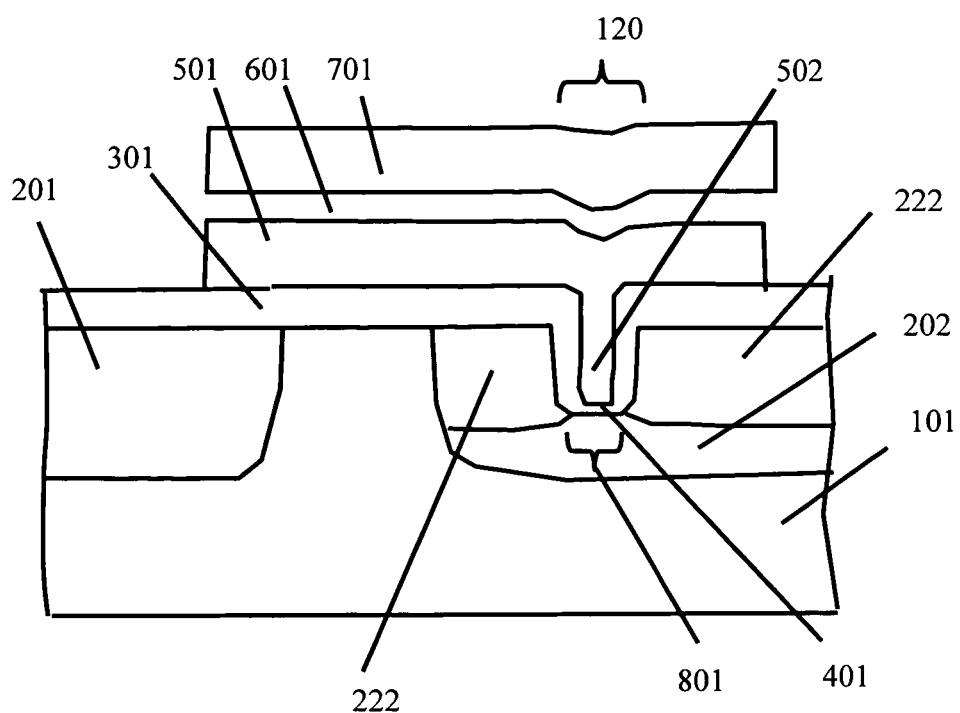
FIG. 5 shows a cross-sectional view illustrating the fifth embodiment of an electrically erasable and programmable nonvolatile semiconductor memory device according to the present invention.

FIG. 5 shows a cross-sectional view illustrating the fifth embodiment of an electrically erasable and programmable nonvolatile semiconductor memory device according to the present invention.

Difference to the fourth embodiment shown by FIG. 4 is that the entire region along the side wall of the hole is occupied by the N-type high impurity concentration region 222. The drain region 202 can be made to have a lower resistance. Formation of the tunnel region 801 on the side wall of the hole 120 is prevented and formation of the tunnel region 801 only on the bottom region of the hole is permitted by forming the N-type high impurity concentration region 222 so that the tunnel region 801 of the drain region 202 along the hole is only formed on the bottom region of the hole 120. Accordingly the area of the tunnel region 801 can be made smaller and the coupling ratio larger compared to the fourth embodiment shown by FIG. 4. Explanation for other part of the structure having the same numeral as in FIG. 4 is omitted.

By the improvements described above, an electrically erasable and programmable nonvolatile semiconductor memory device having a small occupation area, an efficient rewrite operation at a lower voltage during a data program/erase cycle and a high reliability realized by suppression of degradation in the tunnel insulating film can be obtained.

What is claimed is:

1. An electrically erasable and programmable nonvolatile semiconductor memory device, comprising:
   a first conductivity-type semiconductor substrate;
   a second conductivity-type source region and a drain region disposed apart to face each other on a surface of the semiconductor substrate;
   a channel formation region sandwiched by the source region and the drain region, formed on the surface of the semiconductor substrate;
   a floating gate electrode disposed on a gate insulating film over the source region, the drain region and the channel region;
   a control gate electrode disposed on a control insulating film over the floating gate electrode and capacitively coupled to the floating gate electrode;
   a hole disposed in a part of the drain region, formed from a surface of the drain region to an inside thereof;
   a protrusion extended from the floating gate electrode, arranged to fill the hole;
   a tunneling restriction region disposed around the protrusion for defining a tunnel region; and
   a tunnel insulating film formed between a surface of the hole and a surface of the protrusion in the tunnel region.

2. An electrically erasable and programmable nonvolatile semiconductor memory device according to claim 1; wherein the tunneling restriction region is an electrically floating first conductivity-type region disposed in a vicinity of the surface of the drain region around the hole.

3. An electrically erasable and programmable nonvolatile semiconductor memory device according to claim 2; further comprising a second tunneling restriction region being an electrically floating first conductivity-type region, disposed along a bottom surface of the hole formed in the drain region.

4. An electrically erasable and programmable nonvolatile semiconductor memory device according to claim 2; wherein at least one of the tunnel insulating film and the control insulating film is a composite film of a silicon oxide film and a silicon nitride film.

5. An electrically erasable and programmable nonvolatile semiconductor memory device according to claim 2; wherein an edge of a bottom region of the hole formed in the drain region is rounded to give a round shape to the bottom region.

6. An electrically erasable and programmable nonvolatile semiconductor memory device according to claim 1; wherein the tunneling restriction region is a second tunnel insulating film having a thickness thicker than that of the tunnel insulating film formed on the tunnel region, disposed between the protrusion and a second conductivity-type high impurity concentration region disposed in a vicinity of the surface of the drain region around the hole.

7. An electrically erasable and programmable nonvolatile semiconductor memory device according to claim 6; wherein the thickness of the second tunnel insulating film is thick enough to inhibit a generation of tunneling phenomenon even at a maximum electric field applied between the drain region and the floating gate electrode.

8. An electrically erasable and programmable nonvolatile semiconductor memory device according to claim 6; wherein an entire region along a side wall of the hole is occupied by the second conductivity-type high impurity concentration region; and wherein the tunnel region of the drain region along the hole is only formed on a bottom region of the hole.

9. An electrically erasable and programmable nonvolatile semiconductor memory device according to claim 6; wherein at least one of the tunnel insulating film and the control insulating film is a composite film of a silicon oxide film and a silicon nitride film.

* * * * *